METHOD OF FABRICATING SEMICONDUCTOR DEVICE

Filed April 9, 1965 Sheet 1 of 2

INVENTOR.
GEORGE J. GILBERT
BY Glenn H. Bruestle
Attorney

INVENTOR.
GEORGE J. GILBERT
BY
Glenn A Brunette
Attorney

United States Patent Office 3,453,724

Patented July 8, 1969

3,453,724

METHOD OF FABRICATING SEMICONDUCTOR DEVICE

George J. Gilbert, Whitehouse Station, N.J., assignor to Radio Corporation of America, a corporation of Delaware Filed Apr. 9, 1965, Ser. No. 446,962

Int. Cl. B01j *17/00;* H01l *7/24*

U.S. Cl. 29—590 6 Claims

ABSTRACT OF THE DISCLOSURE

A low-temperature method of forming an electrode on the surface of a crystalline silicon body, comprising depositing a film of a first metal about 20 to 1000 angstroms thick on a portion of the body surface, and alloying the film to the body. The film may be so thin as to alloy completely into the body. The first metal is selected from those such as bismuth, gold, gallium, indium, and tin, which form with silicon a eutectic melting below 400° C. A mass of a second metal such as aluminum is then deposited on the same surface portion of the body, and alloyed thereto by heating the body to about 400° to 500° C. According to one embodiment, the alloying is accomplished by very rapid deposition of the metal, utilizing vacuum evaporation at a rate of at least 50,000 angstroms per minute.

BACKGROUND OF THE INVENTION

*Field of the invention*

This invention relates to improved methods of fabricating semiconductor devices. More particularly, this invention relates to improved methods of fabricating improved metallic contacts on semiconductor devices.

*Description of the prior art*

In the manufacture of semiconductor devices such as diodes, triodes, tetrodes, and the like, utilizing as the substrates crystalline wafers composed of semiconductive materials, it is generally necessary to make an electrical connection to a semiconductive body or wafer which includes p-n junctions, or regions of different conductivity. The wafer may consist of silicon, silicon-germanium alloys, germanium, or the like. Since it is difficult to bond a metallic electrical lead wire directly to a semiconductive wafer, it has heretofore been the usual practice to deposit a metallic mass or layer on at least a portion of the wafer, alloy this metallic mass to the wafer, and then bond the electrical lead wire to the metallic mass. The mass may consist of a pure metal such as aluminum, or the like. Alternatively, the metallic mass which serves as the device electrode may consist of a mixture or alloy of several metals, and may include a substance which is a conductivity modifier or doping agent in the particular semiconductor.

Various methods have been employed to make the metallic electrodes on semiconductor devices. When the semiconductor body or wafer utilized consists of silicon, a thin layer of a metal such as aluminum has been deposited, for example by evaporation, over the desired surface of the semiconductor. Standard photolithographic methods known to the art are then utilized to remove the undesired portions of this metal layer. The semiconductor body is next heated to a temperature sufficiently high to alloy the remaining portions of the metal layer to the semiconductor. In the case of an aluminum layer on a silicon body, it is necessary to heat the body to a temperature of about 500° C. to 600° C. for good alloying of the aluminum layer to the silicon body. Although satisfactory devices have been fabricated in this manner, it is known that heating of the silicon body to temperatures as high as 600° C. causes some degradation of the p-n junctions which are already present in the semiconductor. This degradation becomes particularly important for devices designed to operate at high frequencies.

Accordingly, it is an object of this invention to provide an improved method of fabricating improved semiconductor devices.

Another object of the invention is to provide an improved method of fabricating improved electrical connections to semiconductive bodies.

Still another object is to provide an improved method of making improved metallic electrodes on semiconductive bodies.

SUMMARY OF THE INVENTION

These and other objects of the invention are accomplished by depositing a film of metal on at least a portion of the surface of a semiconductor body, and alloying the film into the semiconductor. The metal utilized for this purpose is selected from those which form with the semiconductive body an alloy or eutectic having a low melting point, that is, a melting point lower than that of the semiconductor. A metallic mass is then deposited on the aforesaid surface portion of the semiconductor body, and alloyed thereto. The presence on the semiconductor surface of the low-melting-point alloy or eutectic consisting of the metal film and the semiconductor enables the alloying of the metallic mass and the semiconductor body to be conducted at a low temperature, that is, at a lower temperature than would be possible if the low-melting-point alloy were absent.

DESCRIPTION OF THE PREFERRED EMBODIMENTS

Example I

Figure 1:
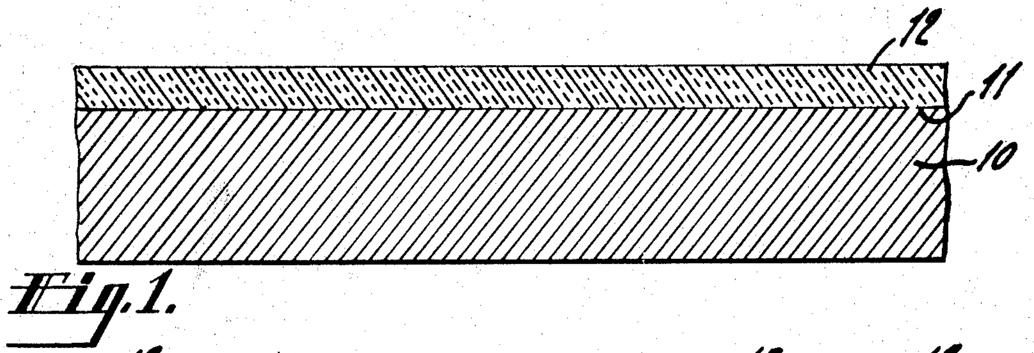
FIGURES 1–8 are cross-sectional views of a portion of a semiconductive body during successive steps in the fabrication of a semiconductor device according to one embodiment of the invention; and, FIGURE 9 is a cross-sectional view of a completed device according to the said one embodiment.

A body or wafer 10 (FIGURE 1) of crystalline semiconductive material is prepared with at least one major face 11. The semiconductive body 10 may consist of germanium, germanium-silicon alloys, silicon, or the like. In this example, the semiconductive body 10 consists of monocrystalline silicon. The semiconductive body 10 may be of either conductivity type, or intrinsic, or compensated. In this example, wafer 10 is of N type conductivity. The precise size and shape of wafer 10 is not critical. Conveniently, the semiconductive wafer 10 is a transverse slice of a monocrystalline ingot, and is sufficiently large so that a plurality of units may be simultaneously formed from the wafer. In this embodiment, wafer 10 is a slice about 7 mils thick and an inch in diameter.

A silicon oxide coating 12 (FIGURE 1) is formed on major face 11 of wafer 10 by any convenient method, such as evaporation. When the semiconductive wafer 10 itself consists of silicon, as in this example, the silicon oxide coating 12 may be formed by thermal oxidation of the wafer in an oxidizing ambient. In this embodiment, the wafer 10 is heated in steam for about 20 minutes at about 1200° C. to form on wafer face 11 a silicon oxide coating 12. The other faces of wafer 10 may be masked during this step, or may also be covered with an oxide coating, which is subsequently removed. Alternatively, the silicon oxide layer 12 may be deposited by treating the wafer 10 in the vapors of a siloxane compound at a temperature sufficient to decompose the siloxane, as described in U.S. Patent 3,089,793, issued on May 14, 1963 to E. L. Jordan and D. J. Donahue, and assigned to the assignee of this application. The latter method is not limited to a silicon substrate, and may be utilized with all crystalline semiconductors.

Figure 2:
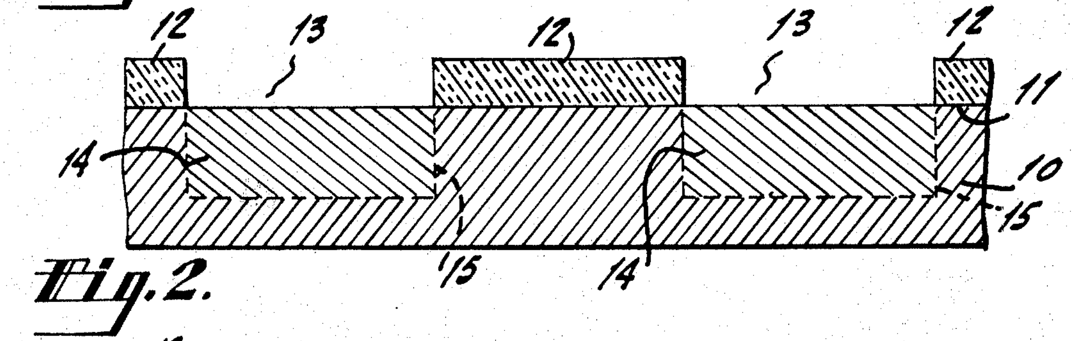

A plurality of apertures 13 (FIGURE 2) are formed in silicon oxide layer 12 by any convenient method, such as standard photolithographic techniques, thus exposing predetermined portions of wafer face 11. A conductivity modifier of type opposite to that of wafer 10 is now diffused into the exposed portions of wafer face 11. In this example, since wafer 10 is N type silicon, a suitable modifier is an acceptor such as boron, aluminum, gallium, or indium. Suitably, the wafer 10 is heated in the vapors of boric oxide for about 35 minutes at 1000° C. The boron diffuses into wafer portions 14 which correspond in size and shape to apertures 13. A p-n junction 15 is formed at the boundary between each boron-diffused P type wafer region 14 and the N type bulk of wafer 10.

Figure 3:
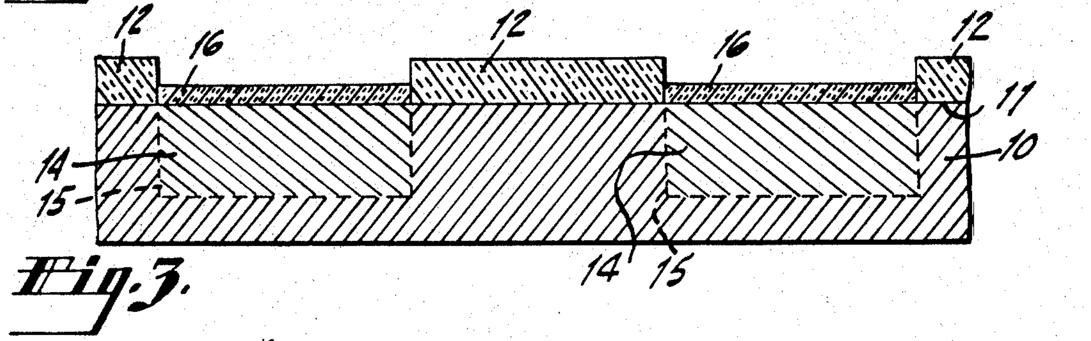

Wafer 10 is now heated in steam for about 50 minutes at 1000° C. A silicon oxide coating 16 (FIGURE 3) is thereby formed over each exposed boron-diffused wafer region 14.

Figure 4:
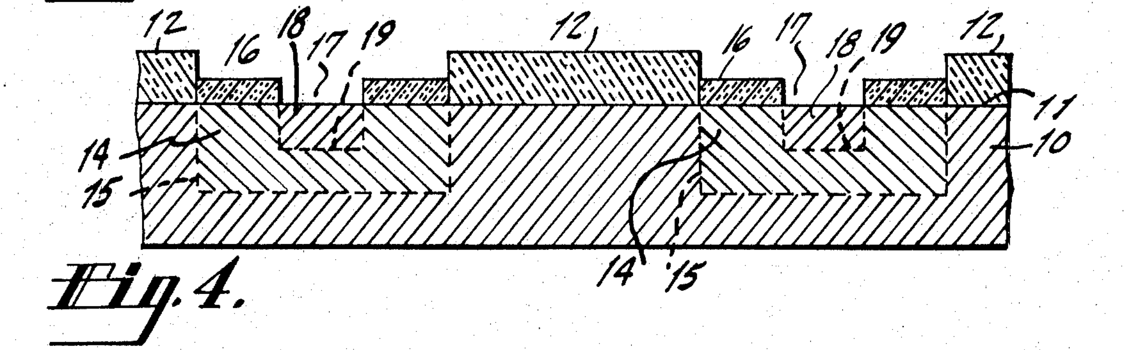

An aperture 17 (FIGURE 4) is formed in each silicon oxide coating 16 by the standard photolithographic techniques mentioned above to expose a predetermined portion of each boron-diffused region 14. A conductivity modifier of the same type as the wafer 10 is now diffused into the exposed portion of each P type region 14. In this example, since the wafer 10 is N type silicon, the modifier used is a donor such as phosphorus, arsenic or antimony. Suitably, wafer 10 is heated in the vapors of phosphorus pentoxide for about 15 minutes at about 1100° C. A plurality of phosphorus-diffused N type regions 18 are thus formed, each region 18 corresponding in size and shape to the adjacent aperture 17. A p-n junction 19 is formed at the boundary between each phosphorus-diffused N type region 18 and each boron-diffused P type region 14.

Wafer 10 is now reheated in steam for a time and temperature sufficient to form a silicon oxide coating 20 (FIGURE 5) over each phosphorus-diffused N type region 18.

Standard masking and etching methods of the art, such as photolithographic techniques, are employed to form an aperture 21 in each silicon oxide coating 20, and an aperture 22 in each silicon oxide coating 16, thereby exposing portions of each N type region 18 and of each P type region 14 respectively. The apertures 22 may be annular in shape, as in this example.

In prior art methods, a layer of a metal such as aluminum has been deposited on the exposed portions of regions 14 and 17, and the metal layer then alloyed to the wafer at temperatures of about 500° to 600° C.

In this example, a thin metal film is deposited on the exposed portions of wafer face 11, so that there is a separate portion 23 (FIGURE 6) of the metal film within each aperture 21 in contact with each separate N type region 18, and a separate portion 24 of the metal film within each aperture 22 in contact with each separate P type region 14. The metal film is conveniently deposited by evaporation over the entire wafer face 11 including the various silicon oxide coatings, after which the undesired portions of the film are removed by standard masking and etching techniques. The thickness of the metal film is suitably about 20 to 1,000 angstroms thick. The metal utilized is one which forms a low-melting-point alloy with the semiconductor wafer 10.

When the wafer 10 consists of silicon, as in this embodiment, the metal film may for example consist of bismuth, which forms with silicon a eutectic melting at 246° C.; gold, which forms with silicon a eutectic melting at 380° C.; gallium, which forms with silicon an alloy melting at a temperature below 400° C.; indium, which forms with silicon a eutectic melting at 156° C.; or tin, which forms with silicon a eutectic melting at 232° C. In this example, the metal films 22 and 23 consist of gold; are deposited by evaporation; and are preferably about 50 to 500 angstroms thick.

The wafer 10 is heated in a non-oxidizing ambient such as forming gas or a vacuum to a temperature of about 400° to 500° C. The metal films 23 and 24 are thus alloyed into the N type regions 18 and into the P type regions 14 respectively. When metal films 23 and 24 are thin, that is, about 100 angstroms thick or less, they alloy completely into the wafer 10, so that they cannot even be seen on the wafer surface. A thin layer (not shown) of the low-melting gold-silicon eutectic is formed on those portions of wafer face 11 which were exposed by the apertures 21 and 22. The wafer 10 at this step is shown in FIGURE 7.

Figures 5, 6, 7, 8, 9:
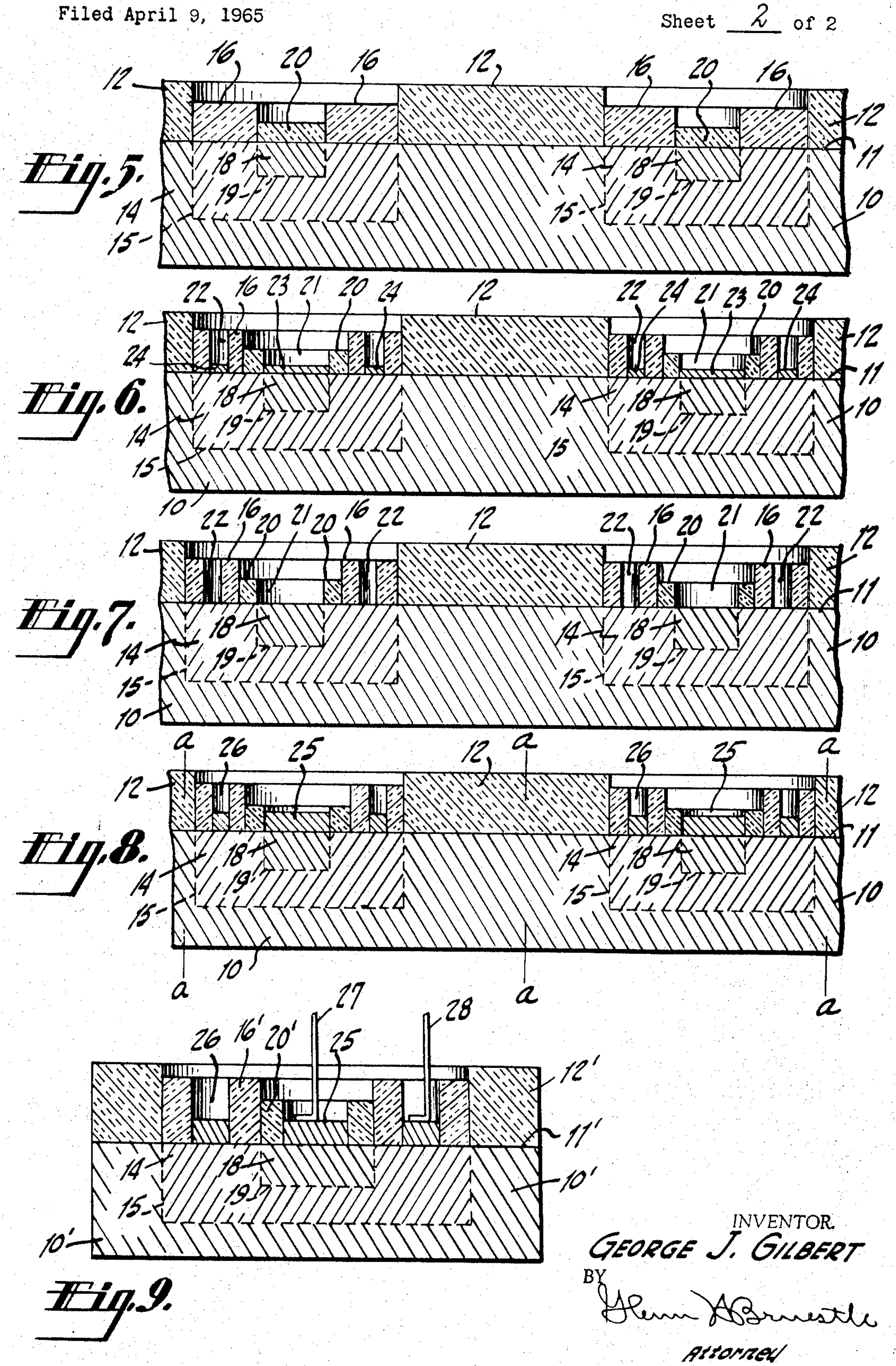

Referring now to FIGURE 8, a mass or layer of an electrically conductive metal is deposited on the exposed portions of wafer face 11, so that separate portions 25 of the metal layer are in contact with each separate N type region 18, and separate portions 26 of the metal layer are in contact with each separate P type region 14. In this example, the metal utilized is aluminum, and is deposited by evaporation. Suitably, the aluminum layer is about 0.02 to 0.5 mil thick. The wafer 10 is now heated to a temperature of about 400° to 500° C., thus alloying aluminum layers 25 and 26 to wafer regions 14 and 18 respectively. The alloyed aluminum masses 25 and 26 serve as the device electrodes.

Wafer 10 is now sub-divided into individual units or dies by cutting the wafer along planes parallel to the dashed lines *a*–*a* in FIGURE 8, and along planes perpendicular to the aforesaid planes.

Each separate die 10′ (FIGURE 9) thus formed includes a boron-diffused P type region 14 which serves as the base region of the device; a p–n junction 15 which is the base-collector junction; an aluminum mass 26 alloyed to the base region 14 and serving as the base electrode; a phosphorus-diffused N type region 18 which serves as the emitter region; a p–n junction 19 which is the emitter-base junction; an aluminum mass 25 alloyed to the emitter region 18 and serving as the emitter electrode.

To complete the device, an electrical lead wire 27 is attached to the emitter electrode 25, and another electrical lead wire 28 is attached to the base electrode 26. The emitter lead wire 27 and the base lead wire 28 suitably consist of aluminum, and are ultrasonically bonded to electrodes 25 and 26 respectively. The remaining steps of mounting the device 10′ with face 11′ upon a metallic header, and encapsulating and casing the device within a sealed enclosure, are accomplished by standard methods of the art, and need not be described here.

An important feature of the method described above is that the wafer need not be subjected to temperatures as high as 600° C. for the formation of the emitter and base electrodes. The emitter and base electrodes 25 and 26 may be formed at temperatures about 100° C. lower than those utilized in the prior art. It has unexpectedly been found that transistors fabricated as described above exhibited an improved power gain of 1.1 db at 80 m.c. as compared to prior art devices. Moreover, the amount of satisfactory product thus fabricated on the production line increased about 17% as compared with the prior art methods. While the precise reasons for the improvement thus obtained is uncertain, it is theorized that the improved results may be due to the lower temperatures which are utilized in forming the device electrodes according to the invention, and the reduction in resistance between the metallic electrodes 25 and 26 and the wafer 10.

Example II

The first steps in the fabrication of a semiconductor device according to this example are conducted as described in Example I above in connection with FIGURES 1–5. Metal films 23 and 24 (FIGURE 6) are then deposited on the exposed portions of wafer face 11 by vacuum evaporation. In this example, films 21 and 22 consist of bismuth, and are about 500 angstroms thick. Moreover, the semiconductor wafer 10 is maintained at a temperature of about 400° to 500° C. during the deposition of the bismuth. As a result, the bismuth alloys to the semiconductive wafer as soon as it is deposited, so that a subsequent alloying step for films 23 and 24 is not necessary.

During the subsequent deposition of metallic masses or layers 25 and 26 to form the emitter and base electrodes respectively, the electrodes 25 and 26 are deposited by vacuum evaporation while maintaining the semiconductor wafer 10 at an elevated temperature. The preferred wafer temperature range for this purpose is below the melting point of the metal or alloy used for the emitter and base electrodes, but above the melting point of the eutectic or low-melting-point composition which has previously been formed on the exposed portions of the wafer by the alloying of metal films 23 and 24 into the semiconductor 10. For example, when the metal used for electrodes 25 and 26 consists of aluminum, the wafer 10 is maintained at a temperature of about 400° to 500° C. during the evaporation of the aluminum. The electrode metal (aluminum in this example) thus alloys to the semiconductor wafer as soon as it is deposited, so that a subsequent alloying step is not necessary.

The remaining steps of dicing the wafer into units, attaching electrical lead wires to the electrodes 25 and 26 of each unit, and encapsulating and casing the unit, are accomplished by standard methods such as in Example I above.

Example III

Another method which avoids a separate alloying step will now be described. It has been found that when a metal is deposited on a crystalline semiconductive body by evaporation at a very rapid rate, so that the thickness of the deposited metal increases at a rate of at least 50,000 angstroms per minute, the portion of the semiconductor where the metal impinges becomes hot, so that the metal alloys to the semiconductor as soon as it deposits thereon.

The first steps in the fabrication of a semiconductor according to this example are conducted as described in Example I above in connection with FIGURES 1–5. Metal films 23 and 24 (FIGURE 6) are then deposited on the exposed portions of wafer face 11 by vacuum evaporation at the rate of at least 50,000 angstroms per minute. Although the wafer is at room temperature, the portions of the wafer immediately beneath films 23 and 24 become hot during this rapid deposition, so that the films 23 and 24 alloy into wafer 10 while they are being deposited.

The subsequent deposition of metallic layers 25 and 26 on wafer 10 to form the emitter and base electrodes respectively is also accomplished by vacuum evaporation at a rate of at least 50,000 angstroms per minute. Although the wafer is at room temperature during this step, the wafer becomes hot as a result of the rapid deposition rate, so that layers 25 and 26 alloy into wafer 10 as they are deposited.

The remaining steps of dicing the wafer into units, attaching electrical lead wires to the electrodes or each unit, and enclosing the unit, are accomplished by standard methods of the art.

The above examples are by way of illustration only, and not limitation. Although the invention has been described for convenience in terms of a double diffused triode transistor, it will be appreciated that electrodes can similarly be made to mesa transistors, diodes of various types, tetrodes, controlled rectifiers, field-effect devices, and other solid state devices having a crystalline semiconductive body. Other semiconductors may be utilized, with appropriate metals or alloys in each case for the films and the electrodes. The metal film may be alloyed to the wafer by one of the techniques described, while the electrodes are alloyed to the wafer by another method. Various other modifications may be made by those skilled in the art without departing from the spirit and scope of the invention as described in the specification and the appended claims.

What is claimed is:

1. The method of fabricating at least one metallic electrode on a silicon wafer, comprising:

depositing on at least a portion of the surface of said wafer a film of gold while maintaining said wafer at a temperature sufficient to alloy said gold film to said silicon wafer as it is deposited, said film being sufficiently thin to alloy completely into said wafer; and, depositing on said portion of the surface of said wafer a mass of aluminum while maintaining said wafer at a temperature of about 400° to 500° C.

2. The method of fabricating at least one metallic electrode on a semiconductor wafer, comprising:

evaporating on and alloying with at least a portion of the surface of said wafer a film of metal capable of forming a low-melting-point alloy with said wafer, said evaporation being performed at the rate of at least 50,000 angstroms per minute, said rate being sufficient to generate at said surface portion sufficient heat to alloy said metal film to said surface portion of said wafer as soon as it deposits thereon; and, alloying to said portion of the surface of said wafer a mass of a conductive metal as the device electrode.

3. The method of fabricating at least one metallic electrode on a semiconductor wafer, comprising:

depositing on at least a portion of the surface of said wafer a film of a first metal capable of forming with said wafer an alloy having a melting point below 400° C., said wafer being maintained during said deposition at a temperature sufficient to alloy said film to said wafer as it is deposited, said film being sufficiently thin to alloy completely into said wafer; and, then alloying a mass of a conductive second metal to said portion of the surface of said wafer at a temperature of 400° to 500° C.

4. The method of fabricating at least one metallic electrode on a semiconductor wafer, comprising:

depositing on at least a portion of the surface of said wafer a film of a metal capable of forming with said wafer an alloy having a melting point below 400° C., said wafer being maintained during said deposition at a temperature sufficient to alloy said film to said wafer as it is deposited, said film being sufficiently thin to alloy completely into said wafer; and, depositing on said portion of the surface of said wafer a mass of a conductive metal, said wafer being maintained during said deposition at a temperature of about 400° to 500° C. to alloy said mass of conductive metal to said portion of the wafer surface as it is deposited.

5. The method of fabricating at least one metallic electrode on a semiconductor wafer, comprising:

evaporating on at least a portion of the surface of said wafer a film of metal capable of forming a low-melting-point alloy with said wafer, said evaporation being performed at the rate of at least 50,000 angstroms per minute, said rate being sufficient to alloy said metal film to said surface portion of said wafer as soon as it is deposited thereon; and, evaporating on said portion of the surface of said wafer a mass of a conductive metal, said evaporation being performed at the rate of at least 50,000 angstroms per minute, said rate being sufficient to alloy said mass of conductive metal to said surface portion of said wafer as soon as it is deposited thereon.

6. The method of fabricating at least one metallic electrode on a silicon wafer, comprising:

evaporating a film of gold on at least a portion of the surface of said wafer, said evaporation being performed at the rate of at least 50,000 angstroms per minute, said rate being sufficient to alloy said gold film to said surface portion of said wafer as soon as it is deposited thereon; and, evaporating on said portion of the surface of said wafer a mass of conductive metal, said evaporation being performed at the rate of at least 50,000 angstroms per minute, said rate being sufficient to alloy said mass of conductive metal to said surface portion of said wafer as soon as it is deposited thereon.

References Cited

UNITED STATES PATENTS

| | | | |
|---|---|---|---|
| 3,050,667 | 8/1962 | Emeis | 29—590 X |
| 3,316,628 | 5/1967 | Lang | 29—590 X |

JOHN F. CAMPBELL, *Primary Examiner.*

P. M. COHEN, *Assistant Examiner.*

U.S. Cl. X.R.

29—473.1, 502; 117—217